US006329214B1

(12) United States Patent
Hattori et al.

(10) Patent No.: US 6,329,214 B1
(45) Date of Patent: Dec. 11, 2001

(54) MANUFACTURE OF FIELD EMISSION DEVICE

(75) Inventors: Atsuo Hattori; Kenichi Miyazawa, both of Hamamatsu (JP)

(73) Assignee: Yamaha Corporation, Tokyo (JP)

( * ) Notice: Subject to any disclaimer, the term of this patent is extended or adjusted under 35 U.S.C. 154(b) by 0 days.

(21) Appl. No.: 09/146,545

(22) Filed: Sep. 3, 1998

(30) Foreign Application Priority Data

Sep. 5, 1997 (JP) .......................... 9-241364

(51) Int. Cl.[7] .......................... H01L 21/00

(52) U.S. Cl. .......................... 438/20; 438/22; 257/10; 257/79

(58) Field of Search .......................... 438/20, 22; 136/254; 257/10, 79

(56) References Cited

U.S. PATENT DOCUMENTS 4,940,916 * 7/1990 Borel et al. .......................... 313/306
5,258,319 * 11/1993 Inuishi et al. .......................... 437/35
5,378,658 * 1/1995 Toyoda et al. .......................... 437/228
5,795,208 * 8/1998 Hattori .......................... 445/50
5,801,477 * 9/1998 Macaulay .......................... 313/309
5,921,838 * 7/1999 Pack et al. .......................... 445/50

OTHER PUBLICATIONS

S. Wolf and R.N. Tauber, Silicon Processing for the VLSI Era, vol. 1 Lattice Press, Calif. Pp 532–535, 1986.*

M. Takai, *Tip Surface Modification of Si Field Emitter Arrays,* Oct. 19, 1995, pp. 15–18.

* cited by examiner

*Primary Examiner*—Matthew Smith
*Assistant Examiner*—Granvill Lee
(74) *Attorney, Agent, or Firm*—Ostrolenk, Faber, Gerb & Soffen, LLP

(57) ABSTRACT

A method of manufacturing a field emission device. The method having the steps of preparing a field emitter array having a plurality of electron emitting elements made of conductive material capable of emitting electrons upon application of an electric field, and impinging particle beams upon the plurality of electron emitting elements at the same time to mill a tip of each electron emitting element and form a sharp tip.

24 Claims, 15 Drawing Sheets

MANUFACTURE OF FIELD EMISSION DEVICE

This application is based on Japanese patent application No. 9-241364 filed on Sep. 5, 1997, the entire contents of which are incorporated herein by reference.

BACKGROUND OF THE INVENTION a) Field of the Invention

The present invention relates to a method of manufacturing a field emission device, and more particularly to a method of manufacturing a field emission device having an emitter tip with a small radius of curvature and a small apex angle.

b) Description of the Related Art

A field emission element emits electrons from a sharp tip of an emitter (electric field emission emitter) by utilizing electric field concentration. For example, a flat panel display can be structured by using a field emitter array (FEA) having a number of emitters. Each emitter controls the luminance or the like of a corresponding pixel of the display.

A conventional manufacture method of a field emission device will be described. First, an emitter having a starting rough shape is made of emitter material. Thereafter, a focussed ion beam (FIB) is applied to the tip of the emitter to make a sharp emitter tip. This technique is disclosed In "Tip Surface Modification of Si Field Emitter Arrays" by M. Takai et al, Proceedings of the 2nd International Display Workshops, Oct. 19, 1995 at Hamamatsu City, Shizuoka, Japan.

This technique makes the emitter sharp by using FIB. Specifically, ions of material having a large atomic weight, such as Ga, are converged into a beam having a very small diameter by using an electronic lens or the like, and this beam is applied to an emitter.

The diameter of the beam is 20 to 240 nm which is smaller than the tip diameter of an emitter. In order to apply the beam to each emitter for a predetermined time, high precision alignment is required. With a manufacture method using FIB, the process time becomes long as the-number of emitters becomes large.

With the method using FIB, a lens system for passing a beam therethrough is required in order to form an effective beam, and also an alignment system is required to precisely align the tip of each emitter with the beam, because the beam diameter is small. Since the lens and alignment systems are required, the manufacture system becomes complicated and expensive.

With this method, since a beam is applied to each emitter after alignment, it takes a long time to sharpen the tips of all emitters. Furthermore, since the lens and alignment systems are required, the manufacture system becomes complicated and expensive.

SUMMARY OF THE INVENTION

It is an object of the present invention to provide a manufacture method of a field emission device capable of sharpening the tip of an emitter (electron emitting electrode) in a short time and with ease.

According to one aspect of the present invention, there is provided a method of manufacturing a field emission device, comprising the steps of: (a) preparing a field emitter array having a plurality of electron emitting elements made of conductive material capable of emitting electrons upon application of an electric field, and (b) impinging particle beams upon the plurality of electron emitting elements at the same time to mill a tip of each electron emitting element and form a sharp tip.

As a particle beam is impinged upon the electron emitting element, its tip is sharpened by milling. As the particle beams are impinged upon a plurality of electron emitting elements at the same time, the tips of the plurality of electron emitting elements can be sharpened at the same time.

Since the tips of the plurality of electron emitting element can be sharpened at the same time, the process time can be shortened. Since the particle beams are impinged upon the plurality of electron emitting elements, a high precision alignment system and a high precision lens system are not required to that a field emission device can be manufactured by a simple and inexpensive system.

DETAILED DESCRIPTION OF THE PREFERRED EMBODIMENTS

FIGS. 1 to 4 are cross sectional views of a field emission device, illustrating the processes of manufacturing the field emission device according to the first embodiment of the invention.

Figure 1:
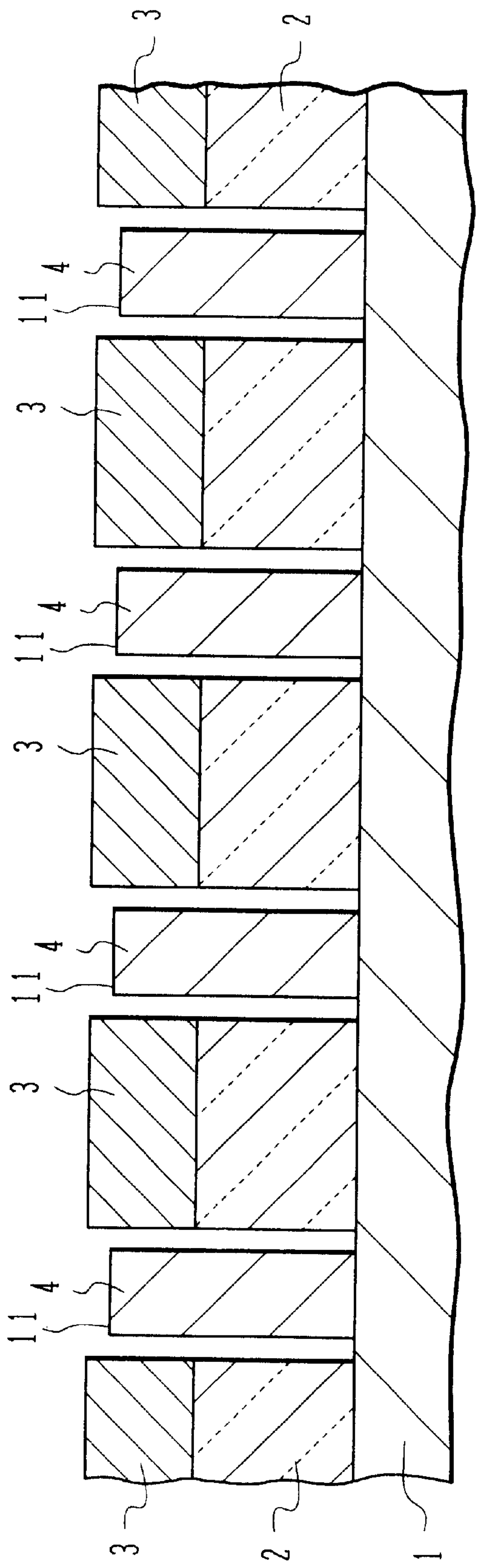
FIGS. 1 to 4 are cross sectional views of a field emission device, illustrating the processes of manufacturing the field emission device according to a first embodiment of the invention.

As shown in FIG. 1, a substrate 1 is prepared which is formed with interlayer insulating films 2, gate layers 3, and emitters 4. This substrate is formed, for example, by the following processes.

Figure 10A:
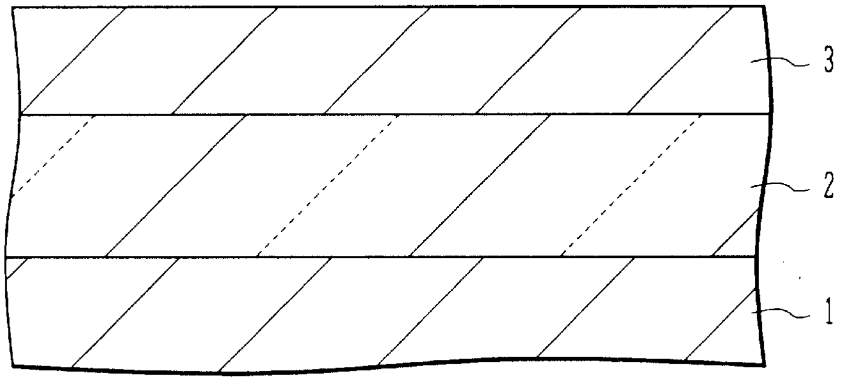
FIGS. 10A to 10F are cross sectional views illustrating the processes of manufacturing the field emission device shown in FIG. 1.

(1) As shown in FIG. 10A, on the whole surface of a substrate 1 made of, for example, Si, an interlayer insulating film 2 is deposited through chemical vapor deposition (CVD). The interlayer insulating film 2 is made of, for example, $SiO_x$ ($SiO_2$).

(2) As shown in FIG. 10A, a gate layer 3 is deposited by CVD on the interlayer insulating film 2. The gate layer 3 is made of, for example, polysilicon doped with P or B. The material of the gate layer 3 may be amorphous Si, $WSi_x$, $MoSi_x$, $TaSi_x$, Al, Cu, or W. This film forming method may use sputtering instead of CVD. A sacrificial film may be deposited on the gate layer 3.

Figure 10B:
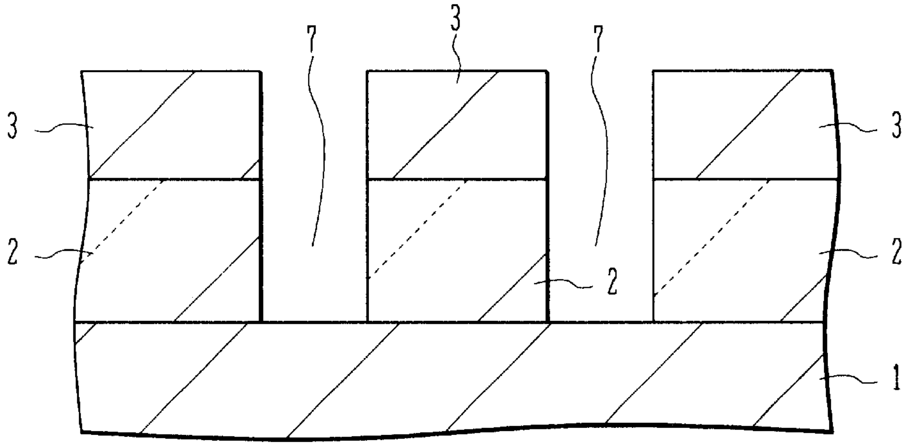

(3) As shown in FIG. 10B, the gate layer 3 and interlayer insulating film 2 are locally removed by photolithography and anisotropic etching to form a plurality of holes (gate holes) 7 where emitters 4 are formed later. The substrate 1 is exposed on the bottom of each hole 7.

Figure 10C:
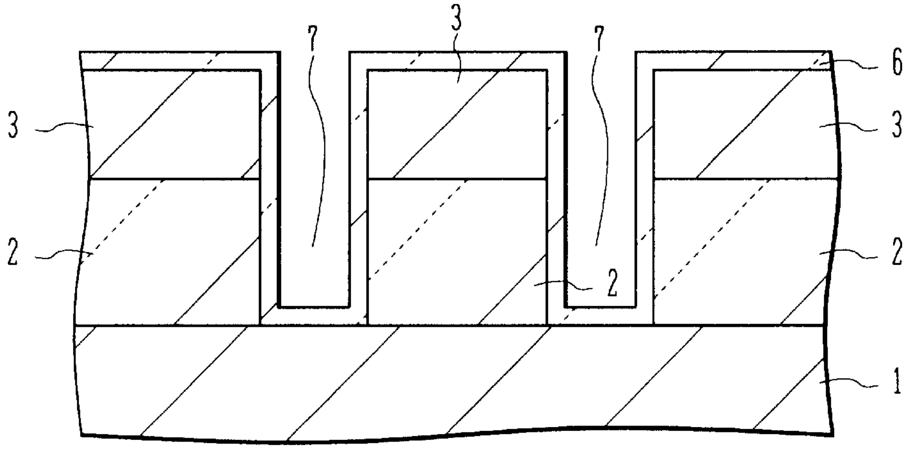
Figure 10D:
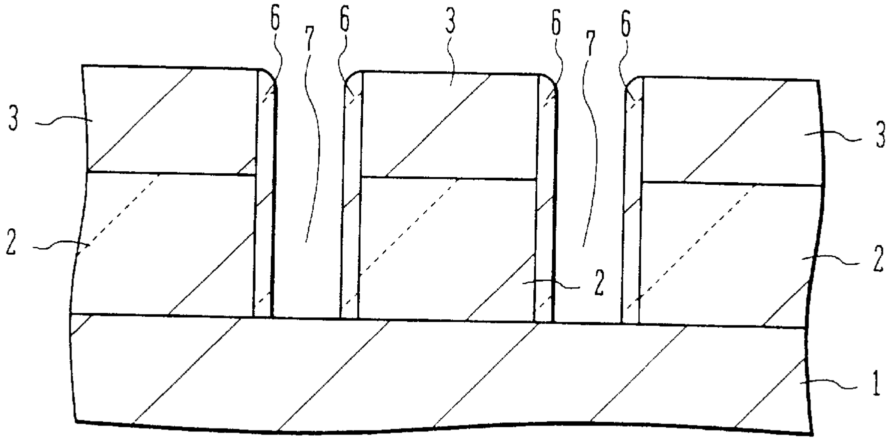

(4) As shown in FIG. 10C, over the whole surface of the substrate, a sacrificial film 6 made of, for example, $SiN_x$, is isotropically deposited thin by CVD. Next, the sacrificial film 6 on the flat top surfaces on the gate layers 3 is removed by anisotropic etching. As shown in FIG. 10D, the sacrificial film 6 on the side walls of the interlayer insulating film 2 and gate layer 3 becomes side spacers. This sacrificial film 6 corresponds to a part of the space formed between the emitter shown in FIG. 1 and the interlayer insulating film 2 and gate film 3.

Figure 10E:
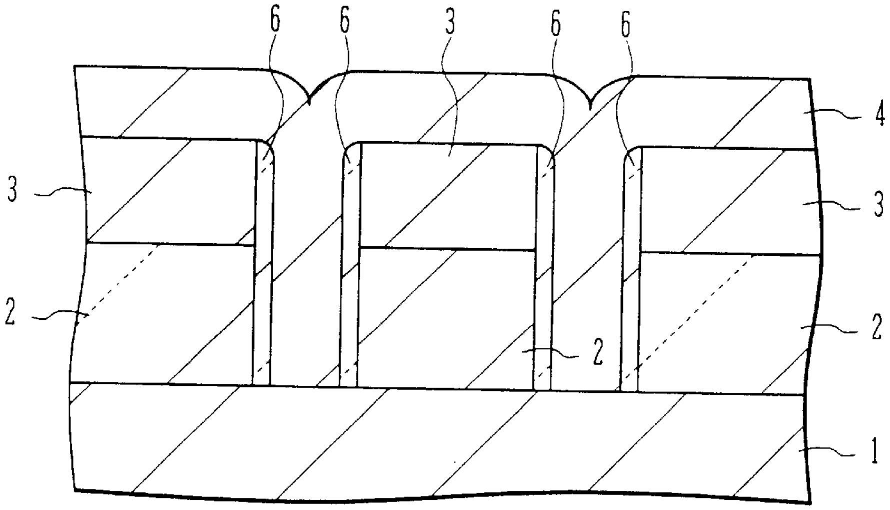

(5) As shown in FIG. 10E, an emitter layer 4 made of, for example, $TiN_x$, is deposited by reactive sputtering, filling the hole (gate hole) 7 formed at the process (3) above. Instead of $TiN_x$, the emitter layer 4 may be made of Mo, Cr, Ti, or W. Instead of sputtering, CVD may be used.

Figure 10F:
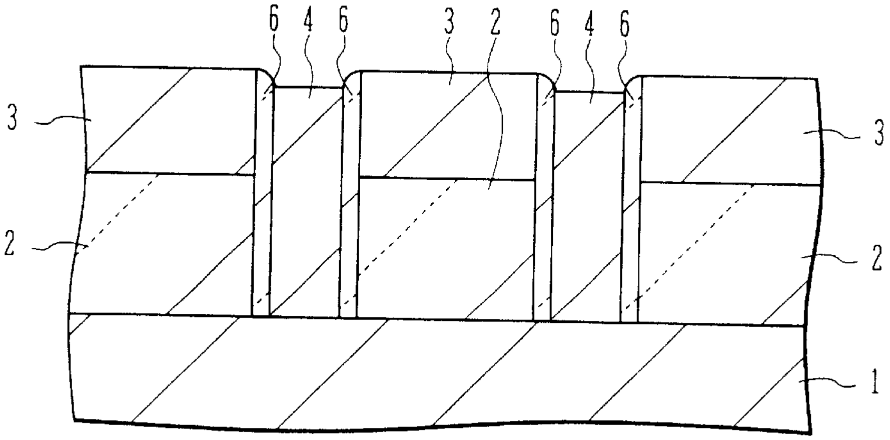

(6) The deposited emitter layer 4 is etched back to form an emitter 4 having a predetermined shape as shown in FIG. 10F.

(7) The sacrificial film 6 on the side walls of the interlayer insulating film 2 and gate film 3 is etched and removed. With the above processes, the substrate shown in FIG. 1 is completed.

With the above processes, a plurality of emitters 4 are formed on the substrate 1. One emitter 4 is formed in one gate hole. The tip (upper end portion) of the emitter 4 is cylindrical, and its top surface 11 Is flat. The emitter 4 is not limited to a cylindrical block shape, but it may take a rectangular block shape.

Figure 2:
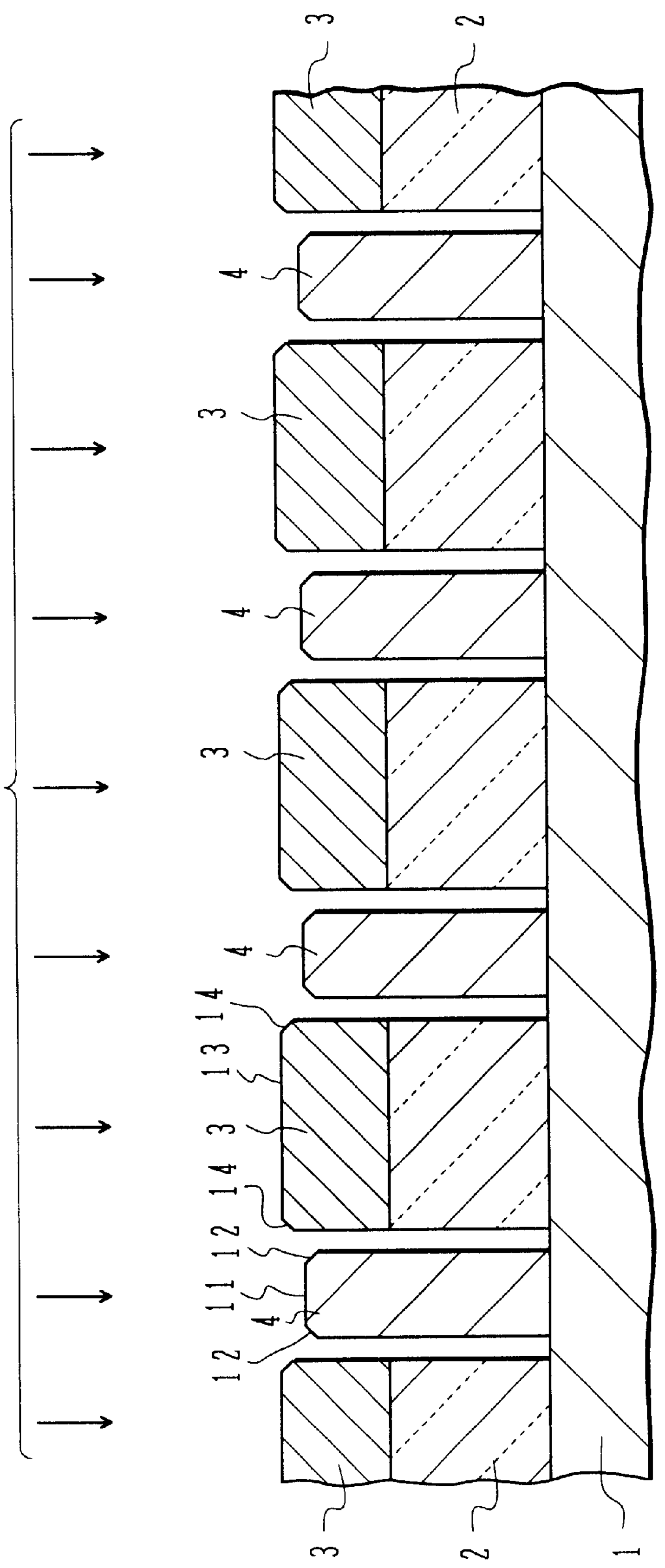

Next, as shown in FIG. 2, for example, Ar ions 5 are impinged upon the whole surface of the substrate. The substrate surface is milled with Ar ions. Ion milling is a process (physical sputtering) of making ionized atoms collide with an object to impart kinetic energy to the object and physically sputter the object. More specifically, ion milling is a process of making ionized atoms collide with a plurality of emitters 4 at the same time without substantially converging the ionized atoms.

For example, the ion milling is performed by using Ar ion gas at an acceleration energy of 700 eV and a current of 800 mA. If the emitter 4 is made of noble metal such as Au, Ag, Pt, Pd, and Cu, it is preferable that the ion beam incidence angle is 30 to 60 degrees relative to a substrate normal direction. The term "noble metal" used in this specification is intended to include Ag and Cu in addition to Au, Pt and Pd. When the ion beam is applied obliquely, it is necessary to rotate the substrate. If the emitter 4 is made of conductive material other than noble metal, such as Si, $WSi_x$, Al and $TiN_x$, it is preferable that the ion beam incidence angle is 0 degree relative to the substrate normal direction.

The flat top surface 11 of the emitter 4 is gradually removed by physical sputtering by Ar ions 5, and at the same time the edge of the flat top surface 11 of the emitter 4 is gradually removed by the physical sputtering to change the right angle edge to a slanted surface 12.

The flat top surface 13 of the gate film 3 is also gradually removed by the physical sputtering by Ar ions, and at the same time the edge of the flat top surface 13 of the gate film 3 is gradually removed by the physical sputtering to change the right angle edge to a slanted surface 14, similar to the emitter 4.

The slanted surfaces 12 and 14 are formed at the same time on the edges of the flat top surfaces of the plurality of emitters 4 and gate films 3. The conditions of ion milling (ion beam) are preferably selected so that the slanted surfaces 12 and 14 are uniformly formed in the whole area of the substrate.

Figure 3:
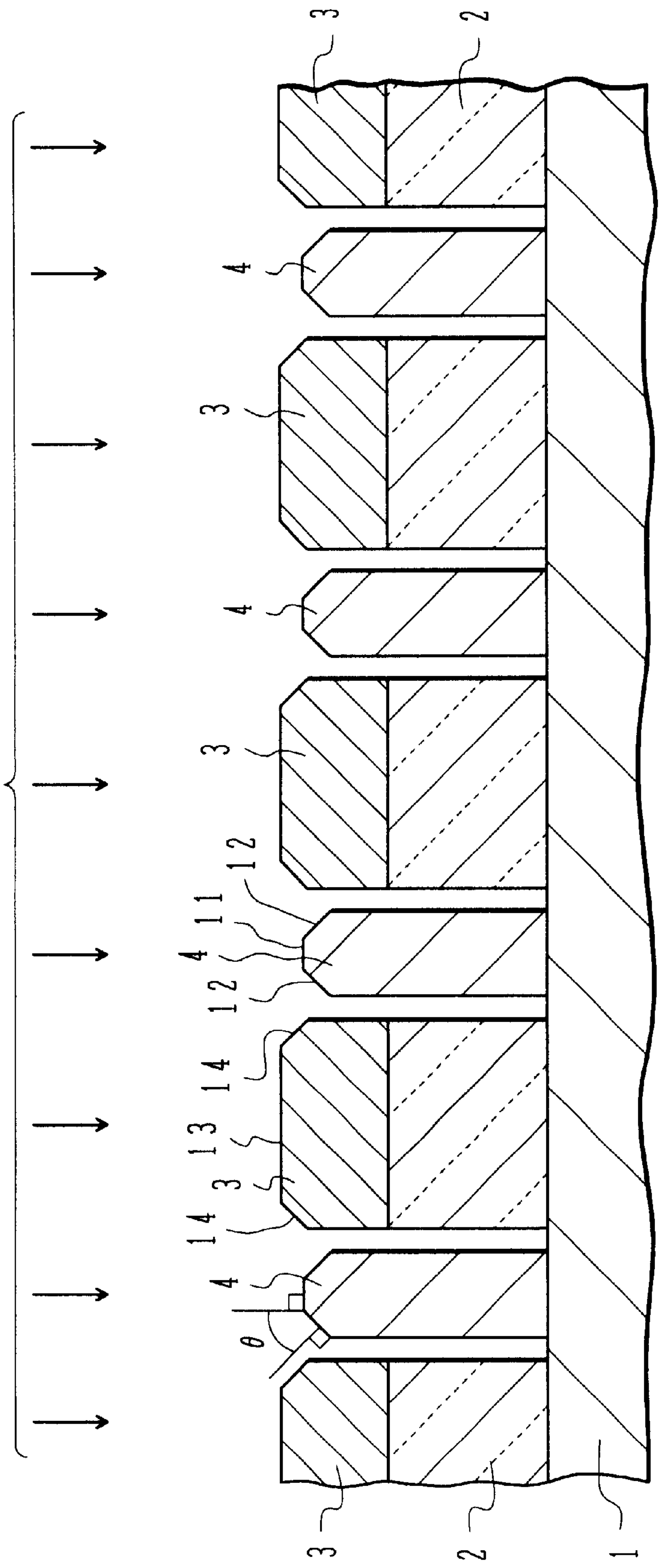

As shown in FIG. 3, as the substrate is further milled through the ion milling by Ar ions 5, the flat surfaces 11 and 13 of the emitter 4 and gate film 3 are further removed by the physical sputtering to reduce the thicknesses thereof in a vertical direction, and at the same time the slanted surfaces of the emitter 4 and gate film 3 are further removed in the angle direction to increase the areas of the slanted surfaces 12 and 14 formed at the originally right angle edges. Next, this angle θ will be detailed.

This angle θ is an angle between the substrate normal direction and a line normal to the milled surface when Ar ions 5 are impinged upon the substrate in the vertical direction. In the following, it is assumed that the emitter 4 is made of material other than noble metal, such as Si, $WSi_x$, Al, and $TiN_x$.

As the ion beam incidence angle θ becomes large starting from 0°, the milling rate becomes fast. For example, the maximum milling rate is achieved in the angle θ range from 40° to 60°. As the surfaces of the emitter 4 and gate film 3 having the right angle edges are ion-milled at an ion beam incidence angle θ of 0°, the right angle edges are ion-milled at the slanted surface angle θ of 40° to 60° providing the maximum milling rate. The angle of the slanted surfaces 12 and 14 is therefore $90°-\theta$ ($\theta=40°-60°$) relative to the substrate normal direction.

Figure 4:
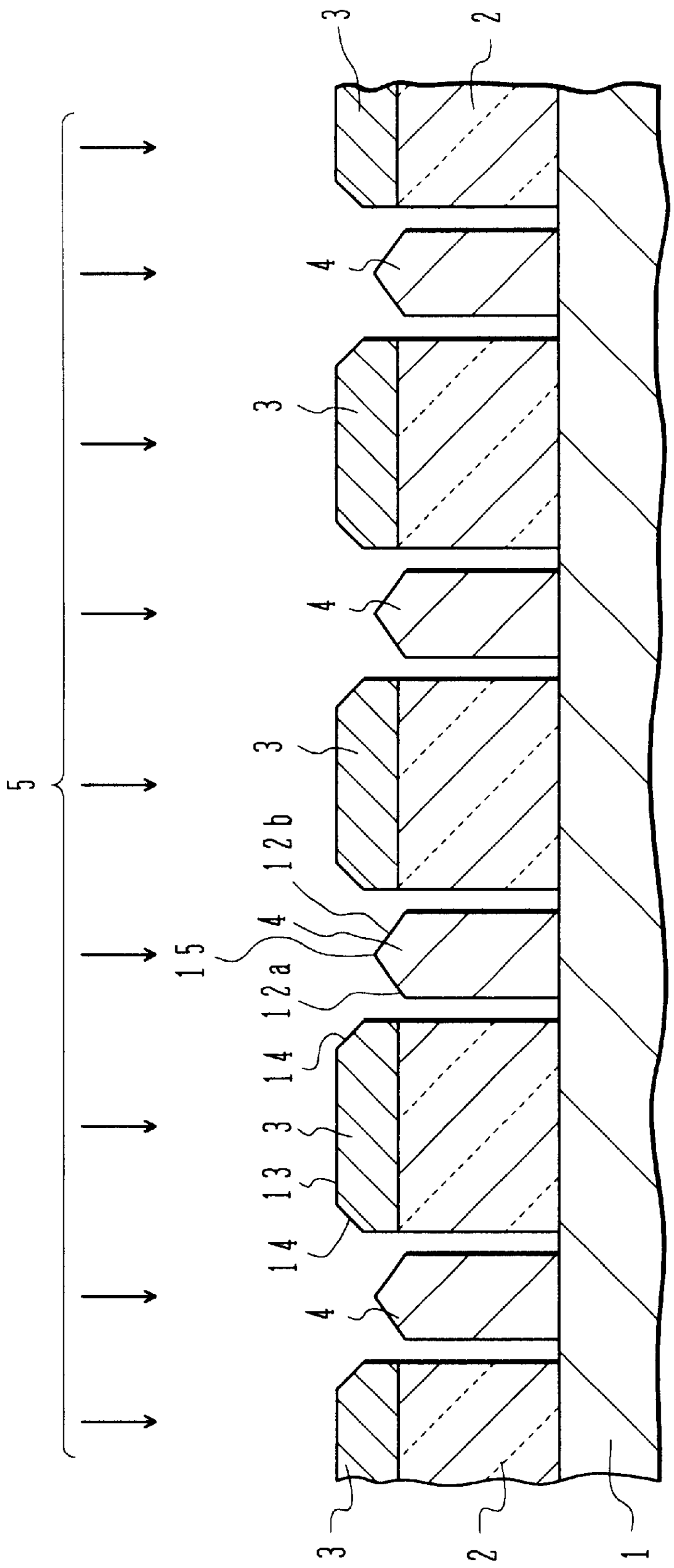

As shown in FIG. 4, as the substrate is further ion-milled with Ar ions 5, the slanted surfaces 12*a* and 12*b* as viewed in FIG. 4 at the originally right angle edges increase their areas further, and eventually intersect with each other at an apex. Since the emitter 4 is originally cylindrical, the tip of the emitter 4 becomes conical. A sharp edge 15 is therefore formed at the intersection of the slanted surfaces 12*a* and 12*b* as viewed in FIG. 4. The slanted surface of the gate film 3 also increases its area further.

As described above, by impinging Ar ions upon the whole surface of the substrate, the tips of the plurality of emitters 4 can be sharpened at the same time in a short time, so that the manufacture throughput can be improved.

Since Ar ions 5 are impinged upon the whole surface of the substrate, an alignment system for applying an ion beam to a single emitter and a lens system for converging the ion beam are not necessary, so that the manufacture system can be made simple and inexpensive.

Milling may by performed by using ion particles other than Ar ion particles. Instead of the ion beam, a beam of particles not ionized may also be applied.

The shape of the emitter 4 before milling is not limited to only a cylindrical block shape, and its top surface is not necessarily required to be flat. The top surface of the emitter 4 before milling may be more or less sharp, and the above milling is performed to sharpen the tip further.

Figure 5:
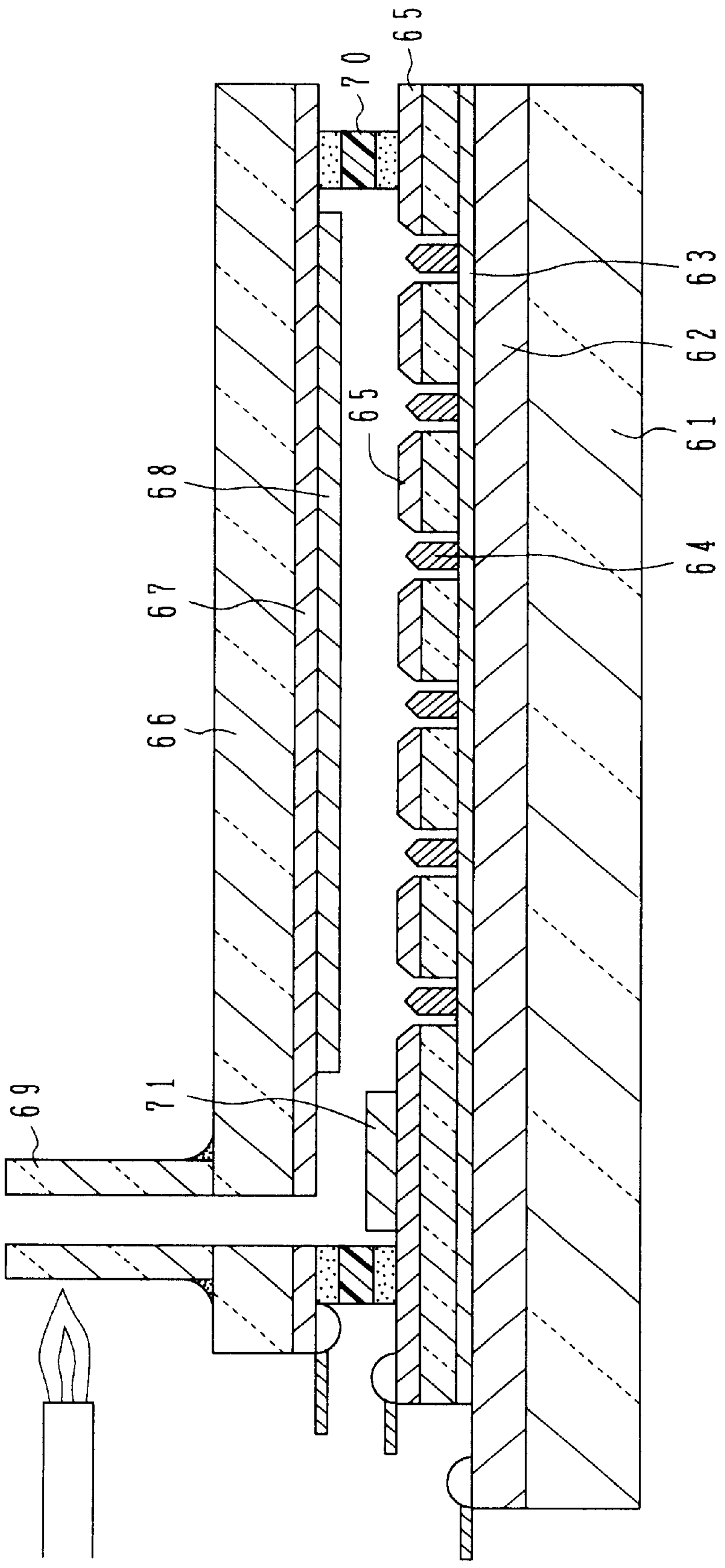
FIG. 5 is a cross sectional view of a flat panel display using a field emission device.

FIG. 5 is a cross sectional view of a flat panel display using a field emission device.

The field emission device manufactured by the embodiment method is used. Formed on a support substrate 61 made of insulating material, are a wiring layer 62 made of Al, Cu, or the like and a resistor layer 63 made of polysilicon or the like. On the resistor layer 63, a number of emitter electrodes 64 whose tip has a small apex angle and a small radius of curvature are disposed to form a field emitter array (FEA). Each gate electrode 65 has a hole (gate hole) near at the tip of each emitter electrode 64 and a voltage can be applied independently to each gate electrode, although not illustrated in FIG. 5. A plurality of emitter electrodes 64 can also be independently applied with a voltage.

Facing an electron source including the emitter electrode 64 and gate electrode 65, an opposing substrate is disposed including a transparent substrate 66 made of glass, quartz, or the like. The opposing substrate has a transparent electrode (anode electrode) 67 made of ITO or the like disposed under the transparent electrode 66 and a fluorescent member 68 disposed under the transparent electrode 67.

The electron source and opposing substrate are joined together via a spacer 70 made of a glass substrate and coated with adhesive, with the distance between the transparent electrode 67 and emitter electrode 64 being maintained about 0.1 to 5 mm. The adhesive may be low melting point glass.

Instead of the spacer 70 of a glass substrate, a spacer 70 made of adhesive such as epoxy resin dispersed with glass beads may be used.

A getter member 71 is made of Ti, Al, Mg, or the like and prevents emitted gas from attaching again to the surface of the emitter electrode 64.

An air exhaust pipe 69 is coupled to the opposing substrate. By using this air exhaust pipe 69, the inside of the flat display panel is evacuated to about $10^{-5}$ to $10^{-9}$ Torr, and then the air exhaust pipe 69 is sealed by using a burner or the like. Thereafter, the anode electrode (transparent electrode) 67, emitter electrode 64, gate electrode 65 are wired to complete the flat panel display.

The flat display panel has a number of three-electrode elements (triodes). A three electrode element has the anode electrode (transparent substrate) 67, emitter electrode 64 and gate electrode 65. The gate electrodes 65 have a number of gate holes. Each emitter electrode 64 is formed in correspondence with each gate hole.

The anode electrode 67 is always maintained at a positive potential. The triodes are two-dimensionally disposed by emitter wirings and gate wirings, and the triode at the cross point of the voltage-applied emitter wiring and gate wiring is selected.

The emitter electrode 64 and gate electrode 65 of the selected triode are applied with negative and positive potentials, respectively, so that electrons are emitted from the emitter electrode 64 toward the anode electrode 67. Electrons emitted from the emitter electrode 64 collide with the fluorescent member 68 which emits light.

FIGS. 6A to 6H are cross sectional views of a field emission device, illustrating the processes of manufacturing the field emission device according to the second embodiment of the invention.

Figure 6A:
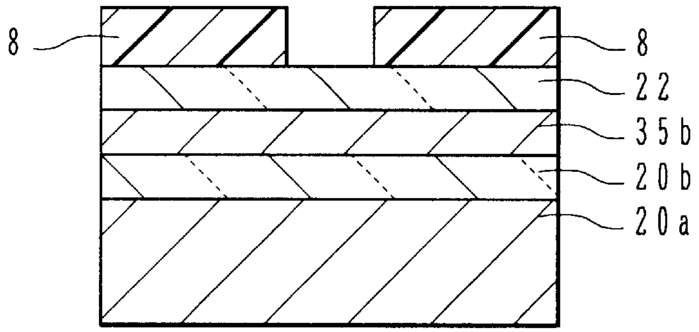
FIGS. 6A to 6H are cross sectional views of a field emission device, illustrating the processes of manufacturing the field emission device according to a second embodiment of the invention.

As shown in FIG. 6A, a first sacrificial film 20*b*, a gate electrode 35*b*, and a second sacrificial film 22 are deposited on a substrate 20*a* in this order from the bottom. The manufacture method thereof will be detailed hereinunder.

The substrate 20*a* is made of, for example, Si. $SiN_x$ is deposited on the substrate 20*a* by CVD to form the first sacrificial film 20*b* having a thickness of 0.2 μm. For example, the sacrificial film 20*b* is formed at a substrate temperature of 800° C. by using $NH_3+SiH_4+N_2$ as source gas.

$SiN_x$ may be deposited by low pressure CVD. In this case, the sacrificial film 20*b* is formed at a substrate temperature of 770° C. by using $NH_3+SiCl_2H_2+N_2$ as source gas. Instead of low pressure CVD, plasma CVD, ECR-CVD, or sputtering may be used for depositing $SiN_x$.

Next, polycrystalline Si is deposited on the first sacrificial film 20*b* by CVD to form the gate electrode 35*b* having a thickness of, for example, 0.2 μm. For example, the gate electrode 35*b* is formed at a substrate temperature of 625° C. by using $SiH_4$ diluted with He as source gas. Impurity ions such as P and B are diffused or implanted into the polycrystalline Si to lower the resistance of the gate electrode 35*b*.

Next, $SiN_x$ is deposited on the gate electrode 35*b* to form the second sacrificial film 22 having a thickness of, for example, 0.2 μm. The second sacrificial film 22 is formed under the same conditions as described above.

Figure 6B:
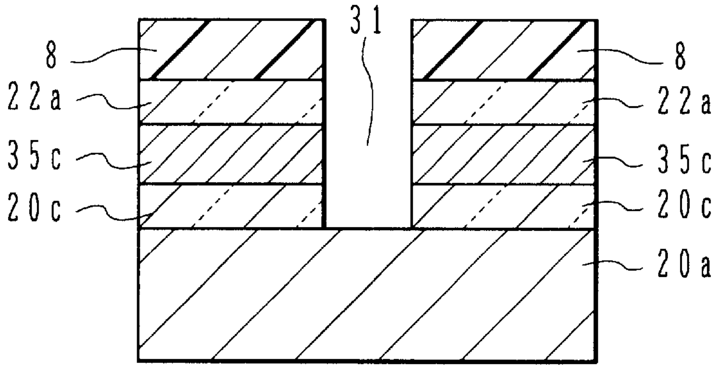

Next, a resist film 8 having a predetermined pattern is formed on the second sacrificial film 22. By using the resist film 8 as a mask, the second sacrificial film 22, gate electrode 35*b*, and first sacrificial film 20*b* are selectively etched to form a recess 31 having generally a vertical side wall as shown In FIG. 6B. The recess 31 has as its side wall the side walls of the first sacrificial film 20*c*, gate electrode 35*c*, and second sacrificial film 22*a*, and as its bottom the surface of the substrate 20*a*. For example, the recess 31 has a diameter of 0.5 μm and a depth of 0.6 μm. Thereafter, the resist film 8 is removed.

Figure 6C:
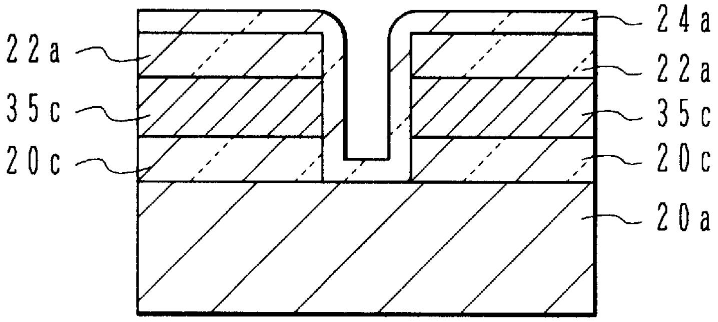

Next, as shown in FIG. 6C, $SiO_x$ ($SiO_2$) is isotropically deposited on the surfaces of the second sacrificial film 22*a* and recess 31 by CVD to form a third sacrificial film 24*a* having a thickness of, for example, 0.10 μm. For example, the third sacrificial film 24*a* is formed at a substrate temperature of 400° C. by using TEOS and $O_3$ as source gas.

Figure 6D:
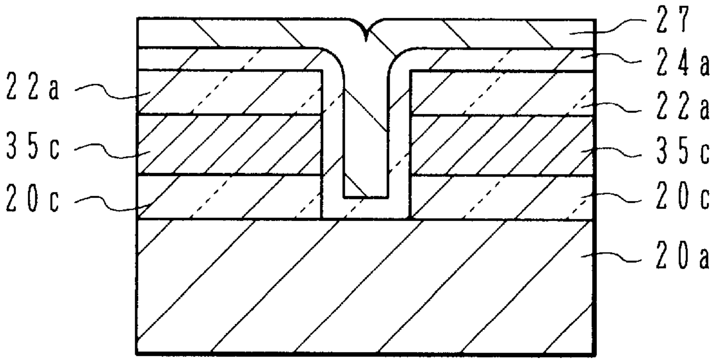

Next, as shown in FIG. 6D, polycrystalline Si is deposited over the whole surface of the substrate by low pressure CVD to form an emitter electrode layer 27 having a thickness of 0.15 μm or thicker. The emitter electrode layer 27 is formed under the same conditions described above. The emitter electrode layer 27 is filled in the recess over the substrate.

Instead of polycrystalline Si, the emitter electrode layer 27 may be formed by depositing amorphous Si, $WSi_x$, $TiN_x$, Al, Cu or the like by CVD. The emitter electrode layer 27 is not limited to a single layer film, but it may be a multi-layer film. For example, a multi-layer emitter electrode layer 27 may be formed by depositing $TiN_x$ by sputtering and thereafter depositing W by CVD.

Figure 6E:
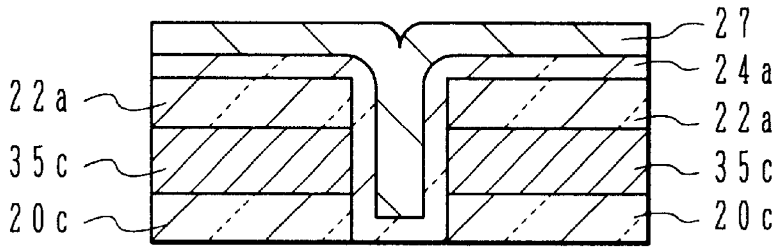

Next, the substrate 20*a* is removed by etching to expose the bottom surfaces of the first and third sacrificial films 20*c* and 24*a* as shown in FIG. 6E. The silicon substrate 20*a* may be etched by using $HF+HNO_3+CH_3COOH$.

Figure 6F:
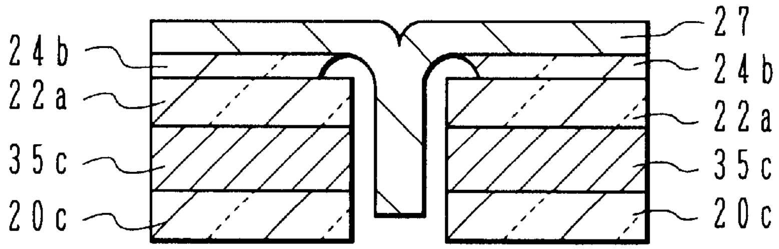

Next, the third sacrificial film 24*a* is partially etched and removed as shown in FIG. 6F to leave some part of the third sacrificial film 24*a* and expose a projection of the emitter electrode 27. The third sacrificial film 24*a* made of $SiO_x$ ($SiO_2$) may be etched by using $HF+NH_4F$.

Figure 6G:
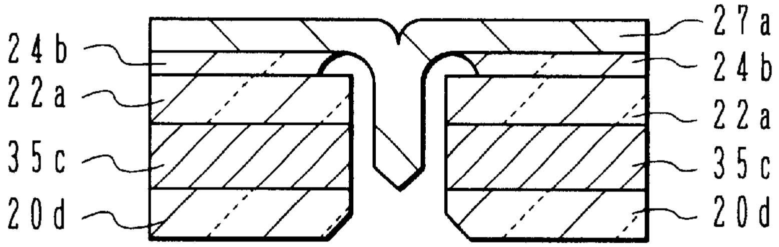

Next, ion milling is performed from the lower side to sharpen the tip of the emitter electrode 27*a* as shown in FIG. 6G. The flat top surface edge of the emitter electrode is abraded and the flat top surface edge of the first sacrificial film 20*d* is also abraded.

For example, ion milling is performed at an acceleration energy of 700 eV and a current of 800 mA by using Ar ion gas. If the emitter electrode 27 is made of noble metal such as Au, Ag, Pt, Pd and Cu, the ion beam incidence angle is preferably 30 to 60 degrees relative to the substrate normal direction. In this case, an ion beam is impinged upon the substrate while the latter is rotated. If the emitter electrode 27 is made of material other than the noble metal, such as Si, $WSi_x$, Al, and $TiN_x$, the ion beam incidence angle is preferably near 0 degree relative to the substrate normal direction.

Figure 6H:
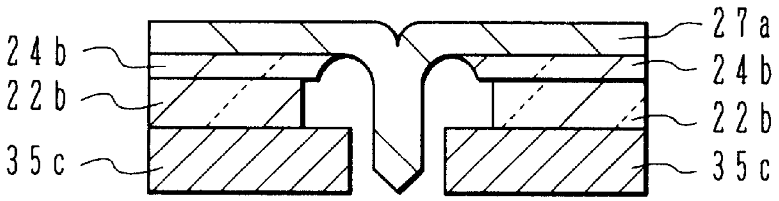

Next, the first sacrificial film 20*d* is etched and removed to expose the bottom surface of the gate electrode 35*c* as shown in FIG. 6H. The first and second sacrificial films 20*d* and 22*d* are both made of $SiN_x$. Therefore, while the first sacrificial film 20*d* is wholly etched and removed, the second sacrificial film 22*a* is partially etched to leave some portion of the second sacrificial film 22*b*. $SiN_x$ is etched by using $HPO_3$ heated to 170° C.

With the above processes, a two-electrode element having the emitter electrode 27*a* and gate electrode 35*c* is completed. In the first embodiment (FIG. 4), while the emitter electrode 4 is sharpened, the flat top surface edge of the gate electrode 3 is also rounded. In the second embodiment (FIG. 6H), the gate electrode 35*c* is not abraded by ion milling so that the gate electrode 35*c* can easily take a desired shape and the gate diameter (gate hole diameter) can be made small. Therefore, a voltage applied to the gate electrode 35*c* to emit electrons from the emitter electrode 27*a* can be lowered.

It is sufficient if at least one of the second and third sacrificial films 22*b* and 24*b* is an insulating film.

FIGS. 7A to 7G are cross sectional views of a field emission device, illustrating the processes of manufacturing the field emission device according to the third embodiment of the invention.

Figure 7A:
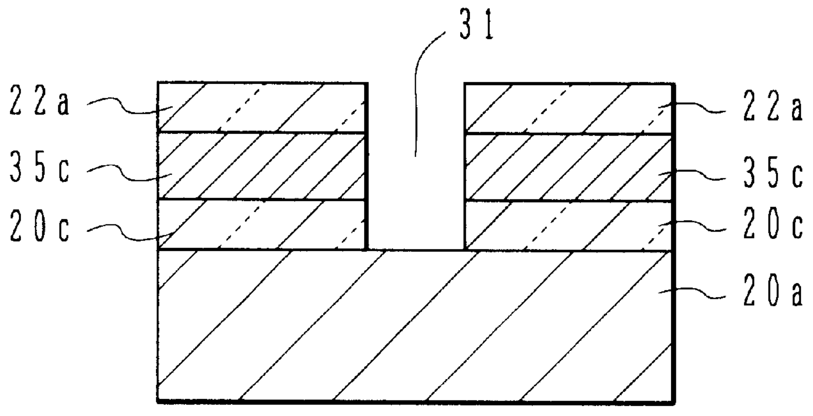
FIGS. 7A to 7G are cross sectional views of a field emission device, illustrating the processes of manufacturing the field emission device according to a third embodiment of the invention.

As shown in FIG. 7A, a first sacrificial film 20*c*, a gate electrode 35*c*, and a second sacrificial film 22*s* respectively having a predetermined pattern are formed on a substrate 20*a* by the same processes shown in FIGS. 6A and 6B. A recess 31 has as its side wall the side walls of the first sacrificial film 20*c*, gate electrode 35*c*, and second sacrificial film 22*a*, and as its bottom the surface of the substrate 20*a*.

Figure 7B:
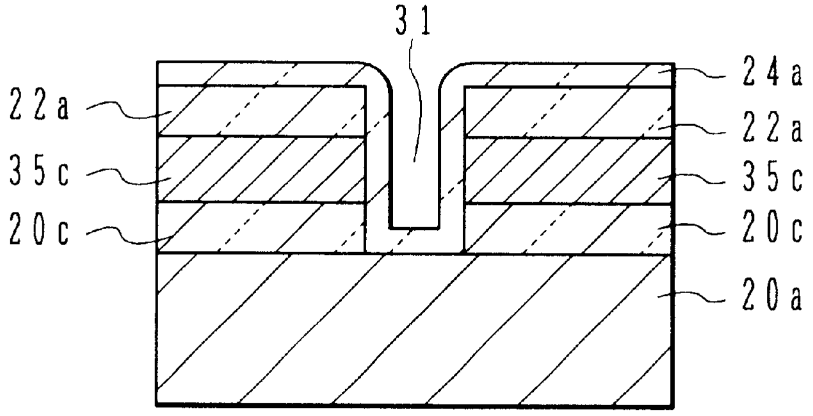

Next, as shown in FIG. 7B, a third sacrificial film 24*a* is isotropically deposited on the surfaces of the second sacrificial film 22*a* and recess 31, by the same process shown in FIG. 6C.

Figure 7C:
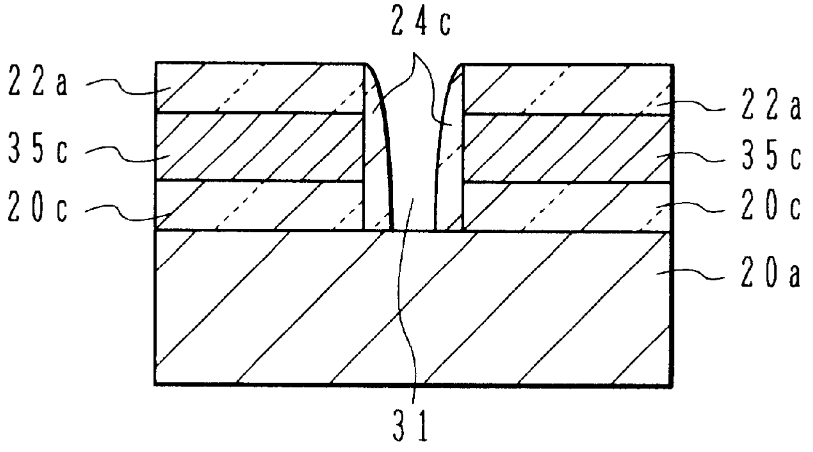

Next, the whole surface of the third sacrificial film 24*a* is anisotropically etched (etch-back) to leave the third sacrificial film 24*c* only on the side wall of the recess 31 as a side spacer, as shown in FIG. 7C. This etch-back is performed by anisotropic dry etching. For example, this etching is performed by using a magnetron RIE system at a reaction chamber pressure of 50 mTorr and a mixture gas of $CHF_3$+$CO_2$+Ar+He as etching gas.

Figure 7D:
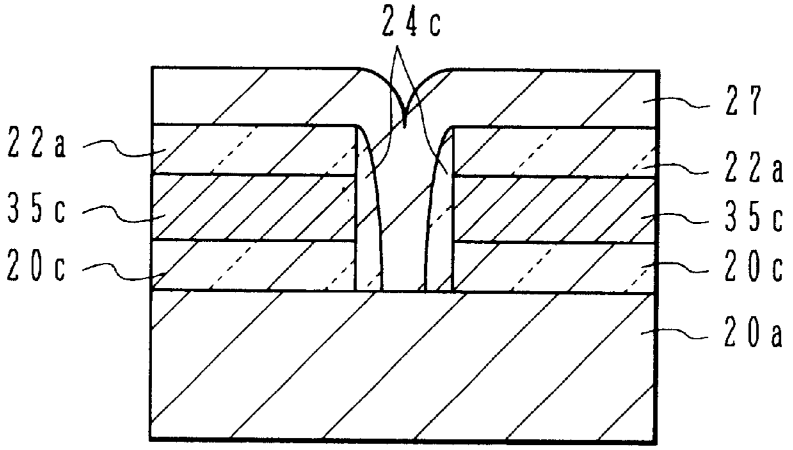

Next, as shown in FIG. 7D, polycrystalline Si is deposited over the whole surface of the substrate by low pressure CVD to form an emitter electrode layer 27 having a thickness of 0.25 $\mu$m or thicker. The emitter electrode layer 27 is formed under the same conditions described above. The emitter electrode layer 27 is filled in the recess surrounded by the side spacer 24*c*.

Instead of polycrystalline Si, the emitter electrode layer 27 may be formed by depositing amorphous Si, $WSi_x$, $TiN_x$, Al, Cu or the like by CVD.

Figure 7E:
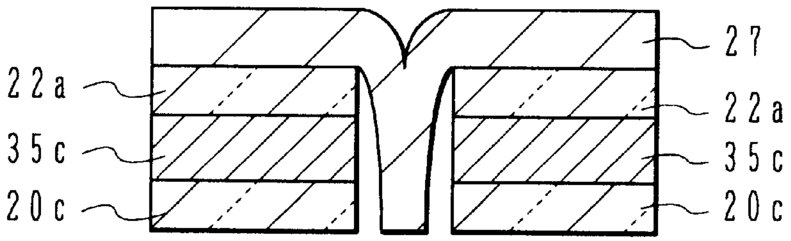

Next, the substrate 20*a* and side spacer 24*c* are removed by etching to expose the bottom surfaces of a projection of the emitter electrode 27 and the first sacrificial film 20*c*, shown in FIG. 7E. The silicon substrate 20*a* may be etched by using $HF+HNO_3+CH_3COOH$. The side spacer 24*c* made of $SiO_x$ ($SiO_2$) may be etched by $HF+NH_4F$.

Figure 7F:
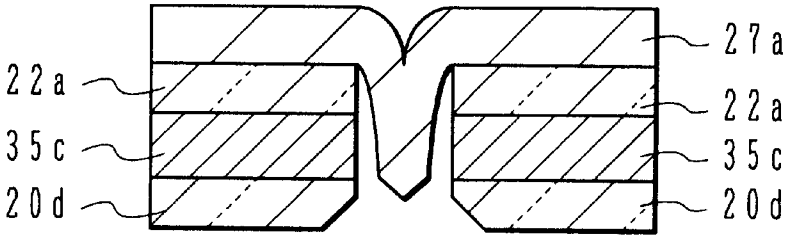

Next, ion milling is performed from the lower side to sharpen the tip of the emitter electrode 27*a* as shown in FIG. 7F. The flat top surface edge of the emitter electrode 27*a* is abraded and the flat top surface edge of the first sacrificial film 20*d* is also abraded.

For example, ion milling is performed at an acceleration energy of 700 eV and a current of 800 mA by using Ar ion gas. If the emitter electrode 27 is made of noble metal such as Au, Ag, Pt, Pd and Cu, the ion beam incidence angle is preferably 30 to 60 degrees relative to the substrate normal direction. In this case, an ion beam is impinged upon the substrate while the latter is rotated. If the emitter electrode 27 is made of material other than the noble metal, such as Si, $WSi_x$, Al, and $TiN_x$, the ion beam incidence angle is preferably near 0 degree relative to the substrate normal direction.

Figure 7G:
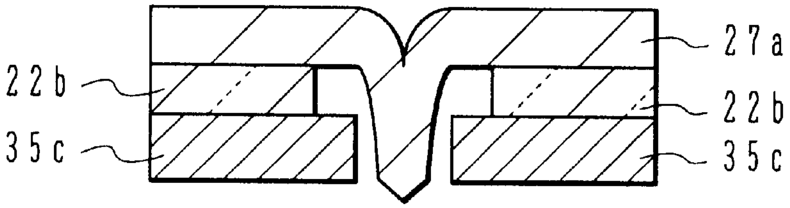

Next, the first sacrificial film 20*d* is etched and removed to expose the bottom surface of the gate electrode 35*c* as shown in FIG. 7G. The first sacrificial film 20*d* made of $SiN_x$ is etched by $HPO_3$ heated to 170° C.

With the above processes, a two-electrode element having the emitter electrode 27*a* and gate electrode 35*c* is completed. In the first embodiment (FIG. 4) and second embodiment (FIG. 6H), the projection of the emitter electrode is cylindrical and has generally the same diameter. In the third embodiment, the projection of the emitter electrode 27*a* becomes thinner toward its tip. Therefore, the emitter electrode layer 27 can be easily filled in the recess and the tip of the emitter electrode can be sharpened easily.

FIGS. 8A to 8G are cross sectional views of a field emission device, illustrating the processes of manufacturing the field emission device according to the third embodiment of the invention.

Figure 8A:
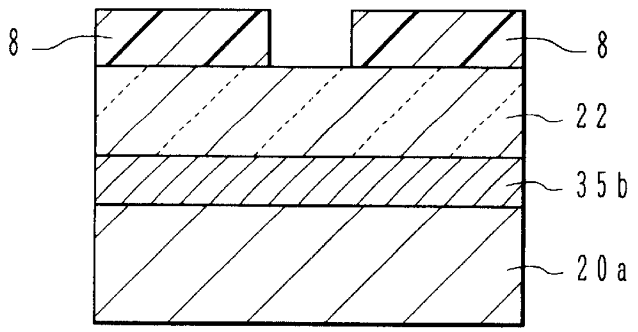
FIGS. 8A to 8G are cross sectional views of a field emission device, illustrating the processes of manufacturing the field emission device according to a fourth embodiment of the invention.

As shown in FIG. 8A, a gate electrode 35*b* and a first sacrificial film 22 are deposited on a substrate 20*a* in this order from the bottom. The substrate 20*a* is made of, for example, Si. First, polycrystalline Si is deposited on the substrate 20*a* to form the gate electrode 35*b* having a thickness of, for example, 0.2 $\mu$m. For example, the gate electrode 35*b* is formed at a substrate temperature of 625° C. by using $SiH_4$ diluted with He as source gas. Impurity ions such as P and B are diffused or implanted into the polycrystalline Si to lower the resistance of the gate electrode 35*b*.

Next, $SiN_x$ is deposited on the gate electrode 35*b* to form the first sacrificial film 22 having a thickness of, for example, 0.25 $\mu$m. For example, the first sacrificial film 22 is formed at a substrate temperature of 800° C. by using $NH_3+SiH_4+N_2$ as source gas.

Figure 8B:
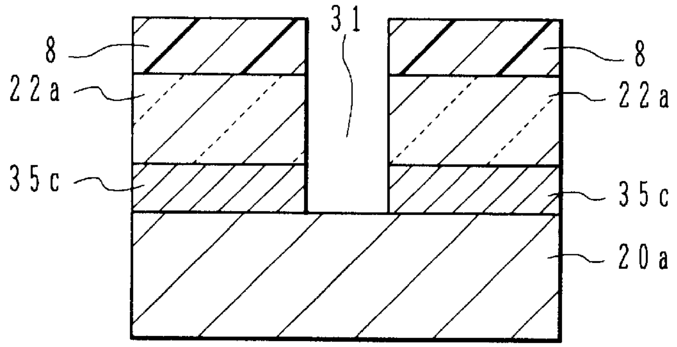

Next, a resist film 8 having a predetermined pattern is formed on the first sacrificial film 22. By using the resist film 8 as a mask, the first sacrificial film 22 and gate electrode 35*b* are selectively etched to form a recess 31 having generally a vertical side wall as shown in FIG. 8B. The recess 31 has as its side wall the side walls of the gate electrode 35*c* and second sacrificial film 22*a*, and as its bottom the surface of the substrate 20*a*. For example, the recess 31 has a diameter of 0.5 $\mu$m and a depth of 0.45 $\mu$m. Thereafter, the resist film 8 is removed.

Figure 8C:
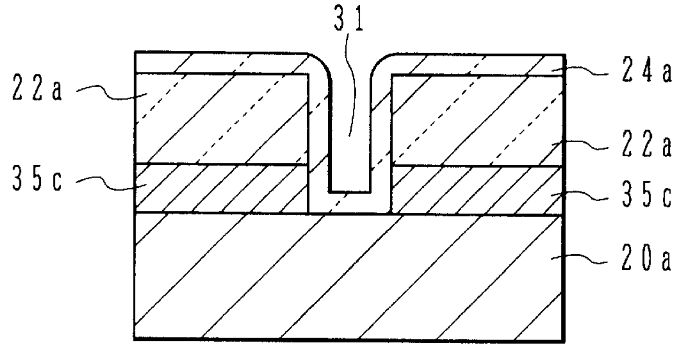

Next, as shown in FIG. 8C, $SiO_x$ ($SiO_2$) is isotropically deposited on the surfaces of the first sacrificial film 22*a* and recess 31 by CVD to form a second sacrificial film 24*a* having a thickness of, for example, 0.10 $\mu$m. For example, the second sacrificial film 24*a* is formed at a substrate temperature of 400° C. by using TEOS and $O_3$ as source gas.

Figure 8D:
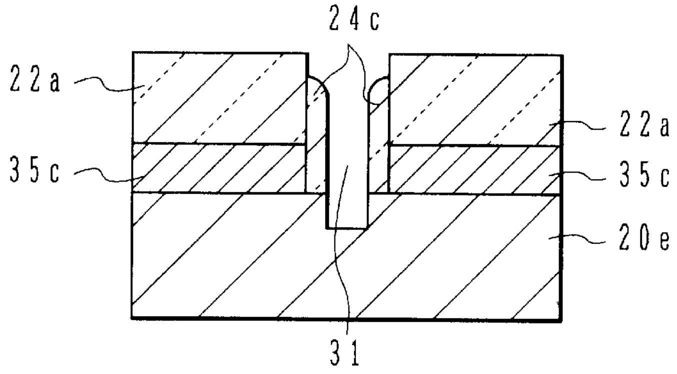

Next, the whole surface of the second sacrificial film 24*a* is anisotropically etched (etch-back) to leave the second sacrificial film only on the side wall of the recess 31 and further etched (over-etch) to leave the second sacrificial film 24*c* on the lower side wall of the recess as a side spacer. With this etching, a recess 31 is formed on the substrate under the original recess 31 as shown in FIG. 8D. This etching is performed by anisotropic dry etching. For example, this etching, is performed by using a magnetron RIE system at a reaction chamber pressure of 50 mTorr and a mixture gas of $CHF_3$+$CO_2$+Ar +He as etching gas.

Figure 8E:
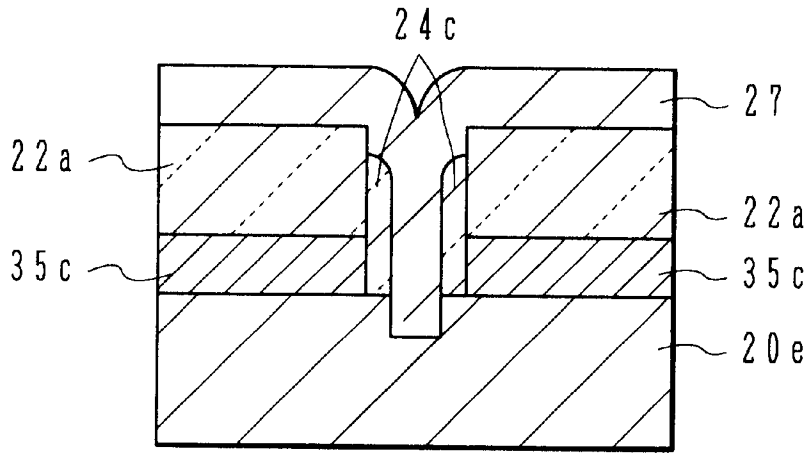

Next, as shown in FIG. 8E, polycrystalline Si is deposited over the whole surface of the substrate by low pressure CVD to form an emitter electrode layer 27 having a thickness of 0.25 μm or thicker. The emitter electrode layer 27 is formed under the same conditions described above. The emitter electrode layer 27 is filled in the recess surrounded by the side spacer 24*c* and the substrate 20*e*.

Instead of polycrystalline Si, the emitter electrode layer 27 may be formed by depositing amorphous Si, $WSi_x$, $TiN_x$, Al, Cu or the like by CVD.

Figure 8F:
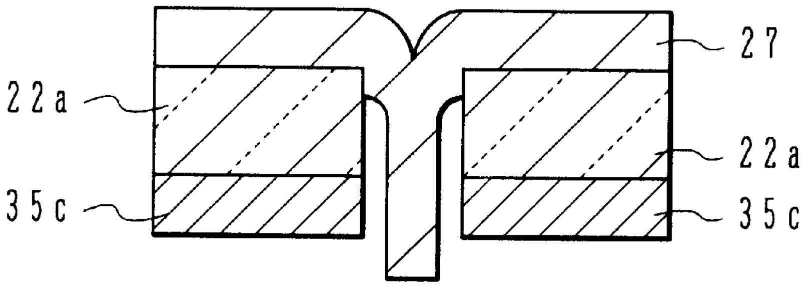

Next, the substrate 20*e* and side spacer 24*c* are removed by etching to expose the bottom surfaces of a projection of the emitter electrode 27 and the gate electrode 35*c*, as shown in FIG. 8F. The silicon substrate 20*e* may be etched by using HF +$HNO_3$+$CH_3COOH$. The side spacer 24*c* made of $SiO_x$ ($SiO_2$) may be etched by HF+$NH_4F$.

Figure 8G:
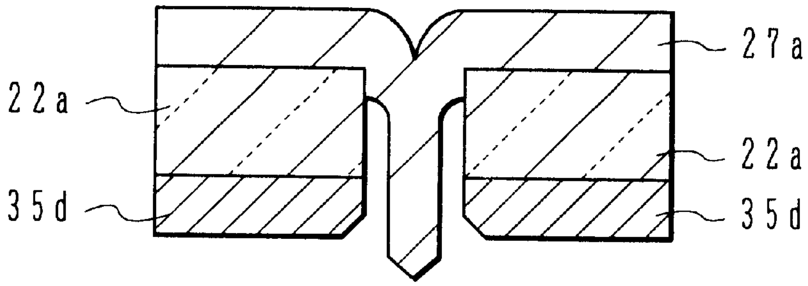

Next, ion milling is performed from the lower side to sharpen the tip of the emitter electrode 27*a* as shown in FIG. 8G. The flat top surface edge of the emitter electrode 27*a* is abraded and the flat top surface edge of the gate electrode 35*d* is also abraded.

For example, ion milling is performed at an acceleration energy of 700 eV and a current of 800 mA by using Ar ion gas. If the emitter electrode 27 is made of noble metal such as Au, Ag, Pt, Pd and Cu, the ion beam incidence angle is preferably 30 to 60 degrees relative to the substrate normal direction. In this case, an ion beam is impinged upon the substrate while the latter is rotated. If the emitter electrode 27 is made of material other than the noble metal, such as Si, $WSi_x$, Al, and $TiN_x$, the ion beam incidence angle is preferably near 0 degree relative to the substrate normal direction.

With the above processes, a two-electrode element having the emitter electrode 27*a* and gate electrode 35*d* is completed. In the fourth embodiment, the recess 20*e* is formed on the substrate 20*e* by over-etch at the etching process shown in FIG. 8D. Therefore, the tip of the emitter electrode 27*a* can be projected in an electron emission direction (toward a lower side as viewed in FIG. 8D. Therefore, a voltage applied to the gate electrode 35*d* to emit electrons from the emitter electrode 27*a* can be lowered.

FIGS. 9A to 9G are cross sectional views of a field emission device, illustrating the processes of manufacturing the field emission device according to the fifth embodiment of the invention.

Figure 9A:
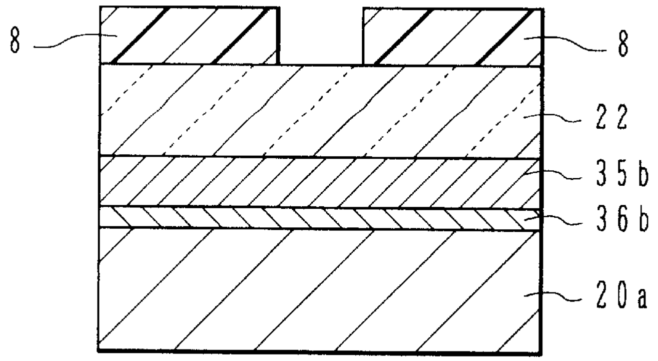
FIGS. 9A to 9G are cross sectional views of a field emission device, illustrating the processes of manufacturing the field emission device according to a fifth embodiment of the invention.

As shown in FIG. 9A, a first gate electrode 36*b*, a second gate electrode 35*b*, and a first sacrificial film 22 are deposited on a substrate 20*a* in this order from the bottom. The substrate 20*a* is made of, for example, Si. First, Ti is deposited by sputtering on the substrate 20*a* to form the first gate electrode 36*b* having a thickness of, for example, 0.1 μm. For example, a DC sputtering system is used and Ti is used as a target while Ar gas is introduced.

Instead of Ti, the first gate electrode 36*b* may be made of $TiN_x$ or $TiO_xN_y$. $TiN_x$ or $TiO_xN_y$ may be deposited by reactive sputtering using Ar+$N_2$ or Ar+$N_2$+$O_2$ as source gas.

Polycrystalline Si is deposited by CVD on the first gate electrode 36*b* to form the second gate electrode 35*b* having a thickness of, for example, 0.15 μm. For example, the second gate electrode 35*b* is formed at a substrate temperature of 625° C. by using $SiH_4$ diluted with He as source gas. Impurity ions such as P and B are diffused or implanted into the polycrystalline Si to lower the resistance of the second gate electrode 35*b*.

Next, $SiN_x$ is deposited on the second gate electrode 35*b* to form the first sacrificial film 22 having a thickness of, for example, 0.2 μm. For example, the first sacrificial film 22 is formed at a substrate temperature of 800° C. by using $NH_3$+$SiH_4$+$N_2$ as source gas.

Figure 9B:
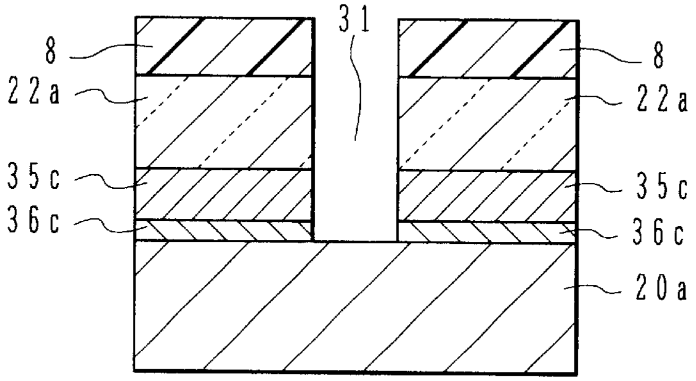

Next, a resist film 8 having a predetermined pattern is formed on the first sacrificial film 22. By using the resist film 8 as a mask, the first sacrificial film 22, second gate electrode 35*b*, and first gate electrode 36*b* are selectively etched to form a recess 31 having generally a vertical side wall as shown in FIG. 9B. The recess 31 has as its side wall the side walls of the first gate electrode 36*c*, second gate electrode 35*c*, and first sacrificial film 22*a*, and as its bottom the surface of the substrate 20*a*. For example, the recess 31 has a diameter of 0.5 μm and a depth of 0.45 μm. Thereafter, the resist film 8 is removed.

Figure 9C:
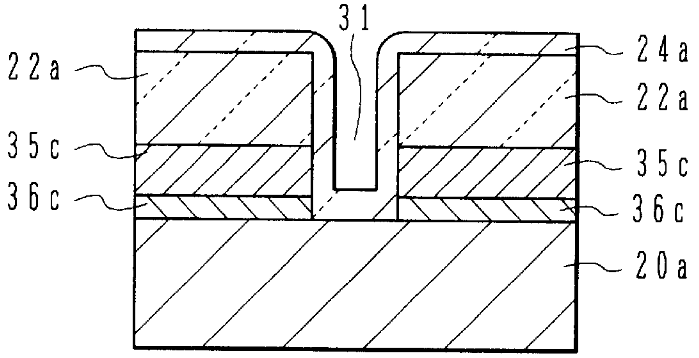

Next, as shown in FIG. 9C, $SiO_x$ ($SiO_2$) is isotropically deposited on the surfaces of the first sacrificial film 22*a* and recess 31 by CVD to form a second sacrificial film 24*a* having a thickness of, for example, 0.10 μm. For example, the second sacrificial film 24*a* is formed at a substrate temperature of 400° C. by using TEOS and $O_3$ as source gas.

Figure 9D:
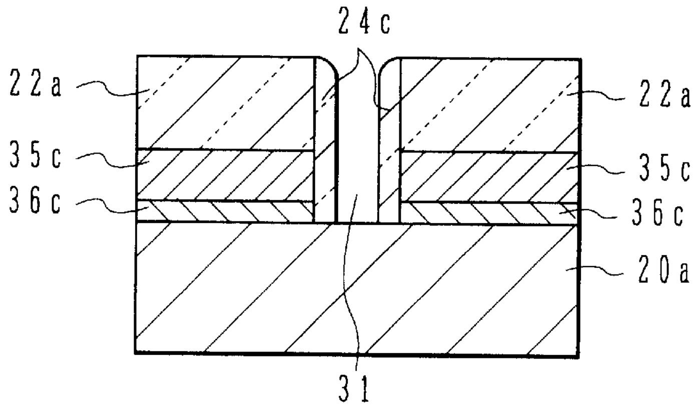

Next, the whole surface of the second sacrificial film 24*a* is anisotropically etched (etch-back) to leave the second sacrificial film 24*c* only on the side wall of the recess 31 as a side spacer as shown in FIG. 9D. This etching is performed by anisotropic dry etching. For example, this etching is performed by using a magnetron RIE system at a reaction chamber pressure of 50 mTorr and a mixture gas of $CHF_3$+$CO_2$+Ar+He as etching gas.

Figure 9E:
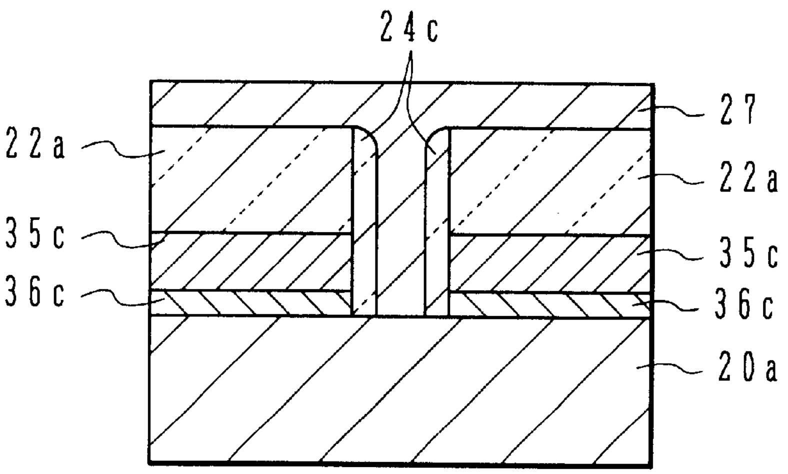

Next, as shown in FIG. 9E, noble metal such as Au, Ag, Pt, Pd and Cu is deposited over the whole surface of the substrate to form an emitter electrode layer 27. Noble metal can be deposited by coating independent and dispersive ultra-fine particles and baking it at 200 to 300° C. Noble metal may also be deposited by plating, sputtering, or vapor deposition. The emitter electrode layer 27 is filled in the recess surrounded by the side spacer 24*c*.

Figure 9F:
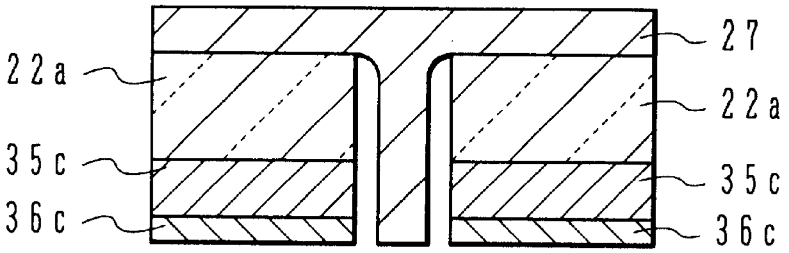

Next, the substrate 20*a* and side spacer 24*c* are removed by etching to expose the bottom surfaces of a projection of the emitter electrode 27 and the first gate electrode 36*c*, as shown in FIG. 9F. The silicon substrate 20*a* may be etched by using HF+$HNO_3$+$CH_3COOH$. The side spacer 24*c* made of $SiO_x$ ($SiO_2$) may be etched by HF+$NH_4F$.

Figure 9G:
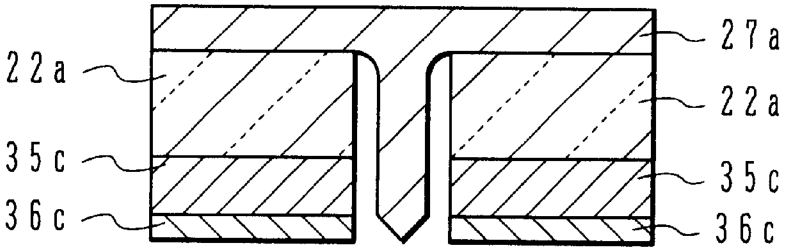

Next, ion milling is performed from the lower side to sharpen the tip of the emitter electrode 27*a* as shown in FIG. 9G. The flat top surface edge of the emitter electrode 27*a* made of noble metal is abraded and the flat top surface edge of the first gate electrode 36*c* made of Ti is also abraded.

For example, ion milling is performed at an acceleration energy of 700 eV and a current of 800 mA by using Ar ion gas. Since the emitter electrode 27 is made of noble metal such as Au, Ag, Pt, Pd and Cu, the ion beam incidence angle is preferably 30 to 60 degrees relative to the substrate normal direction.

Ion milling under the above conditions abrades Au by 140 nm, Ag by 140 nm, Pt by 78 nm, Pd by 110 nm, and Ti by 30 nm. Noble metal is abraded more than Ti.

The flat top surface edge of the emitter electrode 27*a* made of noble metal is easy to be abraded, whereas the flat top surface edge is hard to be abraded. Therefore, while the tip of the emitter electrode 27*a* can be sharpened, the shape of the first gate electrode 36*c* is maintained nearly at it is.

If reactive ion milling added with $O_2$ gas is performed, the first gate electrode 36*c* made of Ti is oxidized and becomes $TiO_x$ ($TiO_2$). A milling rate of $TiO_2$ is 10 nm/min which is one third that of Ti. The abrasion amount of the first gate electrode 36*c* can be made small.

With the above processes, a two-electrode element having the emitter electrode 27*a* and first and second gate electrodes 36*c* and 35*c* is completed. In the fifth embodiment, provision of the first gate electrode 36*c* made of Ti or the like having a low milling rate allows the tip of the emitter electrode 27*a* to be sharpened, while the gate electrode 36*c* is hardly abraded. By preventing the gate electrode 36*c* from being abraded, the gate diameter (gate hole diameter) can be prevented from being broadened. With a smaller gate electrode diameter, a voltage applied to the gate electrode 35*d* to emit electrons from the emitter electrode 27*a* can be lowered.

The second gate electrode 35*b* may not be formed at the process shown in FIG. 9A. In this case, the first gate electrode 36*b* is formed slightly thick (e.g., 0.25 μm).

In the first to fifth embodiments described above, ions such as Ar ions collide with the whole substrate surface so that the tips of a plurality of emitters can be sharpened at the same time in a short time and the manufacture throughput can be improved.

Since ions such as Ar ions are impinged upon the whole surface of the substrate, an alignment system for impinging an ion beam upon a single emitter and a lens system for converging the ion beam are not necessary, so that the manufacture system can be made simple and inexpensive.

Emitters may be milled at the last manufacture process as in the first, fourth, and fifth embodiments. A sacrificial film may be removed after the milling process as in the second and third embodiments. If a field emitter array having a plurality of emitters is prepared and subjected to the milling process, other processes may be performed or not performed thereafter.

The present invention has been described in connection with the preferred embodiments. The invention is not limited only to the above embodiments. It Is apparent that various modifications, improvements, combinations, and the like can be made by those skilled in the art.

What is claimed is:

1. A method of manufacturing a field emission device, comprising the steps of:

(a) preparing a field emitter array having a plurality of electron emitting elements made of conductive material capable of emitting electrons upon application of an electric field; and (b) impinging particle beams upon the plurality of electron emitting elements at the same time to mill a tip of each electron emitting element and form a sharp tip.

2. A method according to claim 1, wherein said step (b) impinges ion beams upon the tips of the plurality of electron emitting elements to ion-mill the tips.

3. A method according to claim 2, wherein said step (b)impinges Ar ion beams upon the plurality of electron emitting elements.

4. A method according to claim 1, wherein said step (a) comprises:

(a-1) forming a gate film on a substrate;

(a-2) forming a plurality of gate holes through the gate film; and (a-3) forming the plurality of electron emitting elements in the plurality of gate holes.

5. A method according to claim 4, wherein the gate film is made of a material selected from a group consisting of Ti, $TiN_x$, and $TiO_xN_y$.

6. A method according to claim 5, wherein the emitter film is made of noble metal.

7. A method according to claim 1, wherein said step (a) forms the electron emitting element having a cylindrical rectangular block shape.

8. A method according to claim 1, wherein the electron emitting element is made of a material selected from a group consisting of Si, $WSi_x$, Al and $TiN_x$.

9. A method according to claim 8, wherein said step (b) impinges particle beams upon the plurality of electron emitting elements at an incidence angle of nearly 0° relative to a normal to a surface of the field emitter array.

10. A method according to claim 1, wherein the electron emitting element is made of noble metal.

11. A method according to claim 10, wherein said step (b) impinges particle beams upon the plurality of electron emitting elements at an incidence angle of 30° to 60° relative to a normal to a surface of the field emitter array.

12. A method according to claim 10, wherein said step (b) impinges particle beams upon the plurality of electron emitting elements, at an angle θ of 40° to 60° between a normal to a surface of the field emitter array and a normal to a surface providing a maximum milling rate.

13. A method according to claim 1, wherein said step (a) comprises:

(a-1) forming a first sacrificial film on a substrate;

(a-2) forming a gate film on the first sacrificial film;

(a-3) forming a second sacrificial film on the gate film;

(a-4) forming holes through the gate film and the first and second sacrificial films;

(a-5) isotropically forming a third sacrificial film covering surfaces of the second sacrificial film and the holes;

(a-6) forming an emitter film on the third sacrificial film, the emitter film filling the holes and being used for forming the electron emitting elements; and (a-7) removing from a bottom side the substrate and some part of the third sacrificial film to expose a tip of each electron emitting element made of the emitter film.

14. A method according to claim 13, further comprising. the step of:

(c) after said step (b), removing from a bottom side the first sacrificial film.

15. A method according to claim 13 wherein at least one of the second and third sacrificial films is an insulating film.

16. A method according to claim 1, wherein said step (a) comprises:

(a-1) forming a first sacrificial film on a substrate;

(a-2) forming a gate film on the first sacrificial film;

(a-3) forming an insulating film on the gate film;

(a-4) forming holes through the first sacrificial film, the gate film, and the insulating film;

(a-5) isotropically forming a second sacrificial film covering surfaces of the insulating film and the holes;

(a-6) anisotropically removing some part of the second sacrificial film to leave some part of the second sacrificial film on a side wall of each hole as a side spacer;

(a-7) forming an emitter film on the insulating film, the emitter film filling the holes and being used for forming the electron emitting elements; and (a-8) removing from a bottom side the substrate and the side spacers to expose a tip of each electron emitting element made of the emitter film.

17. A method according to claim 16, further comprising the step of:

(c) after said step (b), removing from a bottom side the first sacrificial film.

18. A method according to claim 1, wherein said step (a) comprises:

(a-1) forming a gate film on a substrate;

(a-2) forming an insulating film on the gate film;

(a-3) forming holes through the gate film and the insulating film;

(a-4) isotropically forming a sacrificial film covering surfaces of the insulating film and the holes;

(a-5) anisotropically etching some part of the sacrificial film and further etching some part of the sacrificial film and the substrate to leave some part of the sacrificial film on side walls of the gate film and the insulating film in each hole as a side spacer and form a recess in the substrate;

(a-6) forming an emitter film on the insulating film and the side spacer, the emitter film filling the recess of the substrate in each hole and being used for forming the electron emitting elements; and (a-7) removing from a bottom side the substrate and the side spacers to expose a tip of each electron emitting element made of the emitter film.

19. A method according to claim 1, wherein said step (a) comprises:

(a-1) forming a first gate film on a substrate;

(a-2) forming an insulating film on the first gate film;

(a-3) forming holes through the first gate film and the insulating film;

(a-4) isotropically forming a sacrificial film covering surfaces of the insulating film and the holes;

(a-5) anisotropically etching some part of the sacrificial film to leave some part of the sacrificial film on side walls of the holes as side spacers;

(a-6) forming an emitter film on the insulating film and the side spacers, the emitter film filling the holes and being used for forming the electron emitting elements; and (a-7) removing from a bottom side the substrate and the side spacers to expose a tip of each electron emitting element made of the emitter film.

20. A method according to claim 19, wherein the first gate film is made of a material selected from a group consisting of Ti, $TiN_x$, and $TiO_xN_y$.

21. A method according to claim 20, wherein the emitter film is made of noble metal.

22. A method according to claim 20, wherein said step (b) performs reactive ion milling by introducing oxygen gas.

23. A method according to claim 22, wherein the first gate film is made of Ti.

24. A method according to claim 19, wherein said step (a) further comprising the step of:

(a-8) after said step (a-1), forming a second gate film on the first gate film, wherein said step (a-3) forms holes through the insulating film and the first and second gate films.

* * * * *